(12) United States Patent
Yoon (10) Patent No.: US 12,153,076 B2
(45) Date of Patent: Nov. 26, 2024

(54) APPARATUS AND METHOD FOR MEASURING INSULATION RESISTANCE OF VEHICLE

(71) Applicants: Hyundai Motor Company, Seoul (KR); Kia Corporation, Seoul (KR)

(72) Inventor: Jong Hu Yoon, Whasung-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 267 days.

(21) Appl. No.: 17/861,558

(22) Filed: Jul. 11, 2022

(65) Prior Publication Data

US 2023/0062761 A1 Mar. 2, 2023

(30) Foreign Application Priority Data

Aug. 26, 2021 (KR) .................. 10-2021-0113461

(51) Int. Cl.
| | | |
|---|---|---|
| G01R 27/26 | (2006.01) | |
| B60L 3/00 | (2019.01) | |
| G01R 27/02 | (2006.01) | |
| G01R 31/12 | (2020.01) | |
| G01R 31/52 | (2020.01) | |
| H02H 3/16 | (2006.01) | |

(52) U.S. Cl.
CPC ......... *G01R 27/2605* (2013.01); *G01R 31/12* (2013.01); *H02H 3/16* (2013.01); *B60L 3/0069* (2013.01); *G01R 27/025* (2013.01); *G01R 31/52* (2020.01)

(58) Field of Classification Search
CPC ...... G01R 27/00; G01R 27/02; G01R 27/025; G01R 27/26; G01R 27/2605; G01R 31/00; G01R 31/005; G01R 31/006; G01R 31/007; G01R 31/12; G01R 31/50; G01R 31/52; G01R 15/00; G01R 15/14; G01R 15/146; B60L 3/00; B60L 3/0023; B60L 3/0046; B60L 3/0069; B60Y 2200/00; B60Y 2200/90; B60Y 2200/91; H02H 3/00; H02H 3/16; H02H 7/00; H02H 7/18; Y02T 10/00; Y02T 10/60; Y02T 10/70
See application file for complete search history.

(56) References Cited

U.S. PATENT DOCUMENTS 12,071,028 B2 * 8/2024 Hu .................. B60L 50/75
2003/0139889 A1 7/2003 Ragsdale et al.

FOREIGN PATENT DOCUMENTS

| EP | 4113142 B1 * | 8/2024 | ............ B60L 3/0046 |
|---|---|---|---|
| JP | 5818820 | 7/2012 | |
| JP | 2015-210086 | 11/2015 | |
| JP | 2017-044586 | 3/2017 | |

(Continued)

*Primary Examiner* — Hoai-An D. Nguyen
(74) *Attorney, Agent, or Firm* — Morgan, Lewis & Bockius LLP (57) ABSTRACT

An apparatus and a method for measuring an insulation resistance of a vehicle provided with a high voltage system including a battery and a plurality of high voltage electrical components operated by receiving power stored in the battery, includes a controller configured to determine a stray capacitance based on the high voltage electrical components electrically connected to the battery and to determine a measurement period for measuring the insulation resistance of the vehicle based on the determined stray capacitance.

16 Claims, 5 Drawing Sheets

(56) References Cited

FOREIGN PATENT DOCUMENTS

| | | | | |
|---|---|---|---|---|
| JP | 2017147142 A | * | 8/2017 | ............. G01R 31/02 |
| JP | 2020106517 A | * | 7/2020 | ............. G01R 31/50 |
| KR | 10-2013-0061964 | | 6/2013 | |
| KR | 10-2016-0039987 | | 4/2016 | |
| KR | 10-2018-0056091 | | 5/2018 | |
| WO | WO-2015076075 A1 | * | 5/2015 | ........... G01R 27/025 |

* cited by examiner

| vehicle state | | high voltage battery ($C_B$) | HPCU rear ($C_{P\_RR}$) | LDC ($C_{LDC}$) | HPCU front ($C_{P\_FR}$) | A/C COMP ($C_{A/C}$) | fast charging (CQC) | OBC ($C_{OBC}$) | battery heater ($C_{heat}$) | SDC (solar) ($C_{sol}$) | stray capacitance according to vehicle state |
|---|---|---|---|---|---|---|---|---|---|---|---|
| main relay OFF | | ○ | | | | | | | | | $C_B$ |
| main relay ON | start and drive | ○ | ○ | ○ | | | | | | | $C_B + C_{P\_RR} + C_{LDC}$ |
| | high power mode drive | ○ | ○ | ○ | ○ | | | | | | $C_B + C_{P\_RR} + C_{LDC} + C_{P\_FR}$ |
| | high power drive and A/C ON | ○ | ○ | ○ | ○ | ○ | | | | | $C_B + C_{P\_RR} + C_{LDC} + C_{P\_FR} + C_{A/C}$ |
| | fast charging | ○ | ○ | ○ | | | ○ | | | | $C_B + C_{P\_RR} + C_{LDC} + C_{QC}$ |
| | fast charging and battery heater(elevated temperature) | ○ | ○ | ○ | | | ○ | | ○ | | $C_B + C_{P\_RR} + C_{LDC} + C_{QC} + C_{heat}$ |
| | slow charging (OBC operating) | ○ | ○ | ○ | | | | ○ | | | $C_B + C_{P\_RR} + C_{LDC} + C_{OBC}$ |
| | solar charging mode | ○ | ○ | ○ | | | | | | ○ | $C_B + C_{P\_RR} + C_{LDC} + C_{sol}$ |

APPARATUS AND METHOD FOR MEASURING INSULATION RESISTANCE OF VEHICLE

CROSS REFERENCE TO RELATED APPLICATION

The present application claims priority to Korean Patent Application No. 10-2021-0113461, filed Aug. 26, 2021, the entire contents of which is incorporated herein for all purposes by this reference.

BACKGROUND OF THE PRESENT DISCLOSURE

Field of the Present Disclosure

The present disclosure relates to an apparatus and a method for measuring an insulation resistance of a vehicle, and more particularly, to an apparatus and a method for measuring an insulation resistance of a vehicle, the apparatus and the method being configured to predict a stray capacitance of a vehicle's high voltage system based on the state of various electrical components connected to a vehicle battery and to efficiently adjust the insulation resistance measurement period of the vehicle battery based on the size of the predicted stray capacitance.

Description of Related Art

An electric vehicle, which has been actively distributed in recent years, is a vehicle that gets power from an electric motor, and is provided with a high voltage and high capacity battery for storing energy required to power the electric motor.

The battery used in electric vehicles not only stores a lot of energy but also has a high output voltage, so in case of battery cell leakage inside the battery, deterioration of the battery itself, cable short-circuiting of the battery or electrical components forming an electrical connection with the battery, and insulation breakdown of other high voltage electrical components occurs, thus there arises the problem that the vehicle itself is impossible to drive and the risk of electric shock posed to drivers or passengers is increased, and in severe cases, sparks due to overcurrent from the battery or the cables connected to the battery or electrical parts connected through the cables may cause ignition and explosion.

Accordingly, at least one of the plurality of controllers provided in an electric vehicle frequently measures an insulation resistance to quantitatively compare the level of electric leakage between the high voltage battery to run a motor of the vehicle and electrical components connected thereto and a chassis ground of the vehicle, and if the value of this insulation resistance does not meet the safety standards, the vehicle is prohibited from running or the driving performance is limited and a problem of insulation resistance reduction is warned.

A conventional vehicle insulation resistance measuring device alternately measures the resistance between the positive (+) and negative (−) terminals of a battery in the vehicle and the chassis ground of the vehicle according to a preset period. The resistance measurement is performed by measuring the magnitude of the voltage applied to voltage dividing resistors respectively connected to the positive (+) terminal and the negative (−) terminal of the battery.

When a current flowing to the vehicle's chassis ground increases due to a decrease in the insulation resistance between each of the positive (+) and negative (−) terminals of the battery and the chassis ground, the magnitude of the current flowing through the voltage dividing resistors decreases, and the magnitude of the voltage applied to the voltage dividing resistors also decreases.

Therefore, when the controller provided in the vehicle measures the magnitude of the voltage applied to the voltage dividing resistors, and the magnitude of the voltage applied to the voltage dividing resistors becomes smaller than the preset safety reference value, it may be determined that an abnormality has occurred in the insulation resistance of the vehicle.

In this conventional method of measuring insulation resistance, the insulation resistance of the two terminals is measured while the switches connected to the positive (+) terminal and the negative (−) terminal of the battery are alternately turned on or off according to the preset period. Accordingly, the measured resistance is affected by the stray capacitance due to various electrical components connected to a vehicle battery and decreases according to a predetermined time constant when the switch is turned on.

The time constant is determined by the voltage dividing resistors provided in the insulation resistance measuring device and the stray capacitance of the high voltage system connected to the high voltage battery, and accurate insulation resistance measurement becomes possible only when the switch is turned on until the measured voltage across the voltage dividing resistors reaches saturation and remains constant. In other words, it is impossible to accurately measure the voltage of the voltage dividing resistors before the voltage reaches the saturation state by the time constant.

Accordingly, in the conventional method for measuring insulation resistance, the insulation resistance measurement period is determined by referring to the time constant calculated based on the maximum stray capacitance of the high voltage battery of the vehicle and the high voltage system connected thereto. Therefore, the insulation resistance measurement period set based on the maximum stray capacitance is followed even when the stray capacitance is small, and the problem is that it takes an unnecessarily long time.

The information included in this Background of the Invention section is only for enhancement of understanding of the general background of the present disclosure and may not be taken as an acknowledgment or any form of suggestion that this information forms the prior art already known to a person skilled in the art.

BRIEF SUMMARY

Various aspects of the present disclosure are directed to providing an apparatus and a method for measuring an insulation resistance of a vehicle. The apparatus and the method are configured to predict the size of the stray capacitance based on the driving condition of the high voltage system of the vehicle and to set the insulation resistance measurement period appropriately and variably according to the time constant determined based on the predicted size of the stray capacitance, rapidly and accurately detect the insulation resistance that matches the vehicle condition.

In various aspects of the present disclosure, there is provided an apparatus of measuring an insulation resistance of a vehicle provided with a high voltage system including a battery and a plurality of high voltage electrical components operated by receiving power stored in the battery, the apparatus including a controller configured to determine a stray capacitance based on the high voltage electrical components electrically connected to the battery and to determine a measurement period for measuring the insulation resistance of the vehicle based on the determined stray capacitance.

According to an exemplary embodiment of the present disclosure, the controller may include an insulation resistance measurement circuit configured to measure the insulation resistance of a positive (+) terminal of the battery and the insulation resistance of a negative (−) terminal of the battery alternately according to the measurement period, but measure the insulation resistance by detecting the insulation resistance of the positive (+) terminal of the battery and a voltage applied to a portion of a voltage dividing resistor connected to the negative (−) terminal of the battery.

According to an exemplary embodiment of the present disclosure, the controller may be configured to determine a time constant by multiplying the determined stray capacitance and a resistance value of the voltage dividing resistor, and determines the measurement period by multiplying the time constant by a preset constant.

According to an exemplary embodiment of the present disclosure, the controller may identify the high voltage electrical components electrically connected to the battery via a controller area network (CAN) communication.

According to an exemplary embodiment of the present disclosure, the high voltage system further includes a main relay configured to connect or disconnect power of the battery to the plurality of high voltage electrical components, and when the main relay is off, the controller may be configured to determine a capacitance of a Y-capacitor of the battery as the stray capacitance.

According to an exemplary embodiment of the present disclosure, the high voltage system further includes a main relay configured to connect or disconnect power of the battery to the plurality of high voltage electrical components, and when the main relay is on, the controller may be configured to determine a total capacitance of Y-capacitors of each of the high voltage electrical components electrically connected to the battery as the stray capacitance.

In various aspects of the present disclosure, according to various aspects of the present disclosure, there is provided a method for measuring an insulation resistance of a vehicle provided with a high voltage system including a battery and a plurality of high voltage electrical components operated by receiving power stored in the battery, the method including: identifying, by the controller, the high voltage electrical components electrically connected to the battery; determining, by the controller, a stray capacitance based on the high voltage electrical components found to be electrically connected to the battery; and determining, by the controller, a measurement period for measuring the insulation resistance of the vehicle based on the determined stray capacitance, and measuring, by the controller, the insulation resistance of the vehicle according to the determined measurement period.

According to an exemplary embodiment of the present disclosure, in the measuring, the controller is configured to measure the insulation resistance of a positive (+) terminal of the battery and the insulation resistance of a negative (−) terminal of the battery alternately according to the measurement period, but may measure the insulation resistance by detecting the insulation resistance of the positive (+) terminal of the battery and a voltage applied to a portion of a voltage dividing resistor connected to the negative (−) terminal of the battery.

According to an exemplary embodiment of the present disclosure, in the measuring, the controller is configured to determine a time constant by multiplying the determined stray capacitance and a resistance value of the voltage dividing resistor, and may determine the measurement period by multiplying the time constant by a preset constant.

According to an exemplary embodiment of the present disclosure, in the identifying, the controller is configured to identify the high voltage electrical components electrically connected to the battery via the CAN communication.

According to an exemplary embodiment of the present disclosure, in the determining the stray capacitance, the controller is configured to determine a total capacitance of Y-capacitors of each of the high voltage electrical components found to be electrically connected to the battery as the stray capacitance.

According to an exemplary embodiment of the present disclosure, the high voltage system may further include a main relay configured to connect or disconnect power of the battery to the plurality of high voltage electrical components, and the exemplary embodiment may further include determining, by the controller, whether the main relay is on or off before the identifying.

According to an exemplary embodiment of the present disclosure, in the determining whether the main relay is on or off, when the controller concludes that the main relay is off, the controller is configured to determine a capacitance of a Y-capacitor of the battery as a stray capacitance without performing the identifying.

According to an exemplary embodiment of the present disclosure, in the measuring the insulation resistance, when the controller concludes that there is an insulation resistance fault, the controller is configured to block the main relay from being turned on later may further be included.

According to the above-described apparatus and method for measuring an insulation resistance of a vehicle, it is possible to set the optimal insulation resistance measurement period based on the state of the high voltage system including the vehicle high voltage battery and the electrical components connected thereto.

Therefore, according to the above-described apparatus and method for measuring an insulation resistance of a vehicle, it is possible to rapidly and accurately detect the insulation resistance corresponding to the vehicle condition, and furthermore, to secure the safety of the vehicle passengers by preventing an electric shock accident caused by current leakage or a fire due to spark generation in advance.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinbelow, an apparatus and a method for measuring an insulation resistance of a vehicle according to exemplary embodiments of the present disclosure will be described in detail with reference to the accompanying drawings.

Figure 1:
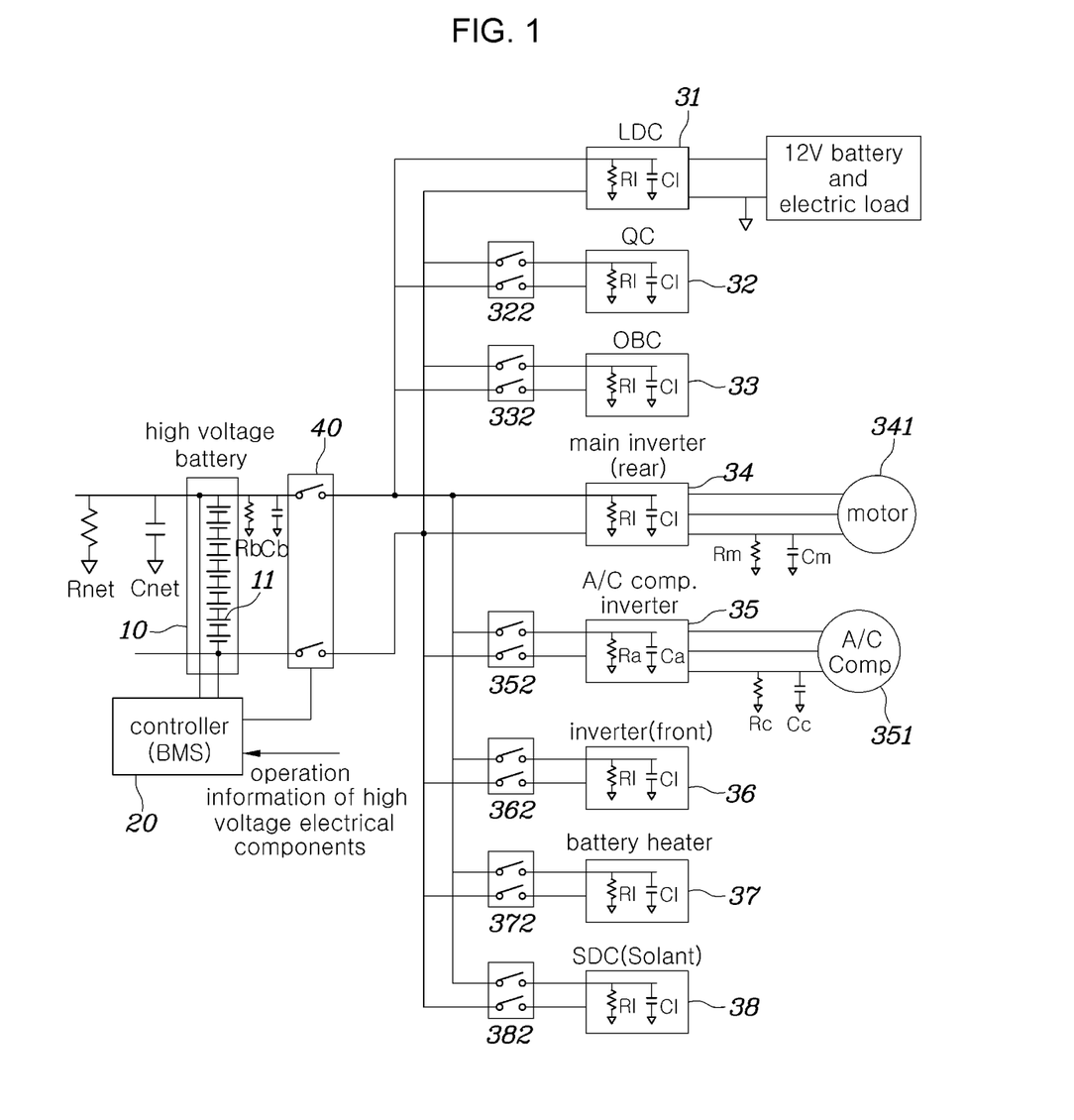
FIG. 1 is a block diagram illustrating an apparatus of measuring an insulation resistance of a vehicle according to various exemplary embodiments of the present disclosure.

FIG. 1 is a block diagram illustrating an apparatus of measuring an insulation resistance of a vehicle according to various exemplary embodiments of the present disclosure.

Referring to FIG. 1, an apparatus of measuring an insulation resistance of a vehicle, according to various exemplary embodiments of the present disclosure, may include a controller 20 including an insulation resistance measurement circuit that measures the insulation resistance between terminals of a vehicle battery 10 and the vehicle's chassis ground.

The high voltage system of the vehicle may include a battery 10, a plurality of high voltage electrical components 31 to 38 operated by receiving power stored in the battery 10, and a main relay 40 that determines the electrical connection state between the battery 10 and the plurality of high voltage electrical components 31 to 38.

The battery 10 may be implemented in a form of a battery pack including a plurality of battery cells 11 that are connected to each other in a series-parallel relationship between two terminals to form an overall voltage of the battery. The plurality of battery cells 11 may form a unit voltage, and the voltage of the entire battery 10 may be determined by the number of the plurality of battery cells 11 and a series-parallel connection relationship.

The controller 20 receives multiple parameters related to performance and operation of the battery from the battery 10, monitors the state of the battery 10, and performs various controls related to battery operation such as charging and discharging of the battery 10. In the field of electric vehicles, the controller 20 may be implemented in a form of a control module or a control device known as a battery management system (BMS).

The plurality of high voltage electrical components 31 to 38 are electrical components connected to a high voltage bus connected to two terminals of the battery 10, and operated with energy stored in the battery 10. In FIG. 1, as an example of the plurality of high voltage electrical components 31 to 38, a low voltage DC converter 31 that converts the voltage of the battery 10 into a size corresponding to the power voltage of an auxiliary battery or a low voltage electric load, a quick charge (QC) device 32, an on-board charger (OBC) 33, and a main inverter 34 that converts DC power into AC power and provides it to a motor 341 that provides driving force to the rear wheels of the vehicle, an inverter 35 for an air conditioner compressor that converts DC power of the battery 10 into AC power to drive the air conditioner compressor 351, and an auxiliary inverter 34 that converts the DC power of the battery 10 into AC power and provides it to a motor that provides driving power to the front wheels of the vehicle, a battery heater 37 that generates heat to increase the temperature of the battery 10 in a low-temperature start condition, and a solar DC charger (SDC) 38 are shown. However, FIG. 1 only shows an example of simple high voltage electrical components, and depending on the vehicle, the high voltage electrical components shown in FIG. 1 may not be provided or other high voltage electrical components not shown may be included.

In accordance with various embodiments of the present disclosure, the controller 20 may include an insulation resistance measurement circuit that measures the insulation resistance of the vehicle.

Figure 2:
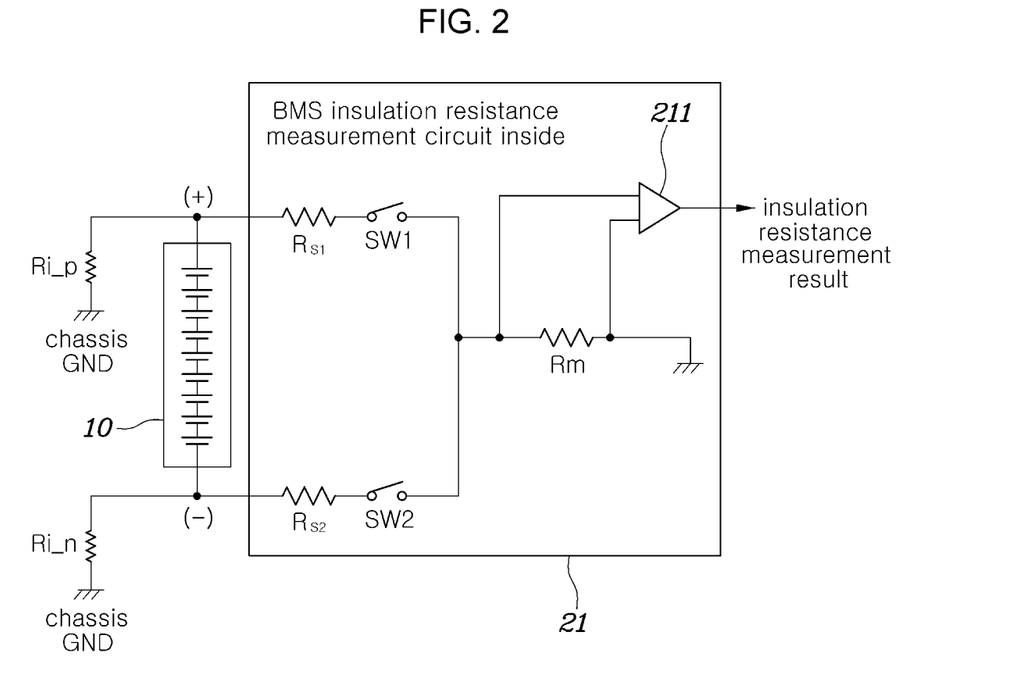
FIG. 2 is a view showing an example of an insulation resistance measurement circuit applied to batteries in a vehicle battery management system according to various exemplary embodiments of the present disclosure.
Figure 3:
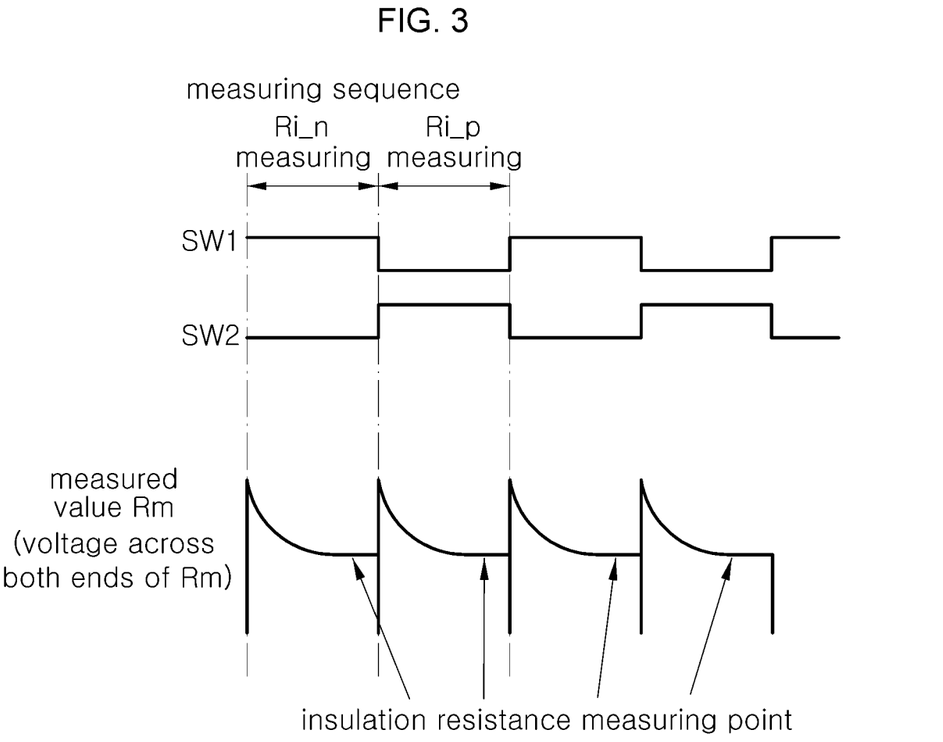
FIG. 3 is a diagram describing the insulation resistance measurement technique by the insulation resistance measuring circuit of FIG. 2.

FIG. 2 is a view showing an example of an insulation resistance measurement circuit applied to batteries in a vehicle battery management system according to various exemplary embodiments of the present disclosure. FIG. 3 is a diagram describing the insulation resistance measurement technique by the insulation resistance measurement circuit of FIG. 2.

As shown in FIG. 2, the insulation resistance measurement circuit 21 may include a first resistor Rs1 whose one end portion is connected to the positive (+) terminal of the battery 10 and a first switch SW1 whose one end portion is connected to the other end portion of the first resistor Rs1, the second resistor Rs2 whose one end portion is connected in series to the negative (−) terminal of the battery 10, the second switch SW2 whose one end portion is connected to the other end portion of the second resistor Rs2, a detection resistor Rm whose one end portion is connected in common to the other end portion of the first switch SW1 and to the other end portion of the second switch SW2 and whose the other end portion is grounded, and a comparator 211 for detecting the voltage across both end portions of the detection resistor Rm.

As shown in FIG. 3, the controller 20 may measure the insulation resistances (Ri_p, Ri_n) of the positive (+) terminal of the battery 10 and the negative (−) terminal of the battery 10 while turning the first switch SW1 and the second switch SW2 on and off alternately according to a predetermined period. The insulation resistances Ri_p and Ri_n shown in FIG. 2 are not actual physical hardware resistors, but virtual resistances predicted to exist between the positive (+) and negative (−) terminals of the battery 10 and the chassis ground of the vehicle.

The voltage value detected by the detection resistor Rm, that is, the voltage across both end portions of the detection resistor Rm, makes a shape as shown in FIG. 3. That is, immediately after the switches SW1 and SW2 are turned on, a relatively high voltage value is output, and the voltage gradually decreases by the time constant determined by the stray capacitance of the high voltage system and the resistor used for detection, and outputs a constant value when the saturation state is reached.

The controller 20 may predict the size of the insulation resistance by use of the voltage value detected by the detection resistor Rm when the voltage is reduced by the time constant to a constant value. The controller 20 may directly determine the size of the insulation resistance using the voltage value detected by the detection resistor Rm, or may determine that an abnormality has occurred in the insulation resistance by comparing the detected voltage value itself with a predetermined reference value.

For example, when the insulation resistance decreases, the magnitude of the current flowing from each of the two terminals of the battery to the vehicle chassis ground increases, and accordingly, the magnitude of the current flowing through the detection resistor Rm decreases. Therefore, the controller 20 may set in advance a reference voltage value which may be used to determine that an abnormality has occurred in the insulation resistance, and when the voltage applied to the detection resistor Rm becomes smaller than the reference voltage value, the controller 20 may determine that an abnormality has occurred in the insulation resistance.

As shown in FIG. 3, the voltage across both end portions of the detection resistor Rm may be gradually decreased from the detected initial value according to the time constant to maintain a constant level. This is due to the capacity of various components included in the high voltage system.

For example, in the insulation resistance detection circuit as shown in FIG. 2, the time constant may be determined by a resistance value (the sum of Rs1 or Rs2 and Rm) of the voltage dividing resistors included in the insulation resistance detection circuit and the stray capacitance of the high voltage system. If the size of the resistance value of the voltage dividing resistors is R and the size of the stray capacitance is C, the time constant may be determined as 'R*C.'

Because the size of the resistance value of the voltage dividing resistors is fixed, the time constant may be changed according to the size of the stray capacitance of the high voltage system.

The size of the stray capacitance may be determined by the state of the battery 10 included in the high voltage system and other high voltage electrical components 31 to 38 connected to the battery 10. In the high voltage electrical components 31 to 38, a Y-capacitor for noise removal may be connected to an input terminal to which power is input from the battery 10. The Y-capacitor may be provided in both the battery 10 and the high voltage electrical components 31 to 38. For example, the Y-capacitor of the battery 10 may include two capacitors connected between each of the positive (+) and negative (−) terminals of the battery 10 and the chassis ground of the vehicle. Furthermore, the Y-capacitor of the high voltage electrical components 31 to 38 may include two capacitors connected between each of the positive (+) and negative (−) terminals of the input terminal to which the power of the battery 10 is input and the chassis ground of the vehicle.

Accordingly, in the high voltage system, the Y-capacitor of the high voltage electrical components electrically connected to the battery 10 forms the stray capacitance of the high voltage system.

Because the connection structure of the Y-capacitor is known in the art, a detailed description made with reference to a separate drawing will be omitted.

For the battery 10 and the high voltage electrical components 31 to 38 to be electrically connected, the main relay 40 needs to be turned on first. In addition, the individual relays 322, 332, 352, 362, 372, and 382 present at the input terminals of the high voltage electrical components 31 to 38 need to be turned on.

The individual relays 322, 332, 352, 362, 372, and 382 may have their states controlled by the controller of the high voltage electrical components 31 to 38 connected thereto.

The controller 20 communicates with a controller provided in each of the high voltage electrical components 31 to 38 through controller area network (CAN) communication to determine whether the high voltage electrical components 31 to 38 form an electrical connection with the battery 10 and whether the individual relays 322, 332, 352, 362, 372, and 382 are turned on.

The controller 20 may store in advance the capacitance by the Y-capacitor of the high voltage electrical components 31 to 38, and when the insulation resistance is measured, determine the stray capacitance by summing the capacitances of the high voltage electrical components 31 to 38 in a state in which an electrical connection with the battery 10 is formed, and determine the time constant by multiplying the determined stray capacitance by the resistance value of the voltage dividing resistors of the insulation resistance measuring circuit 21.

Figure 4:
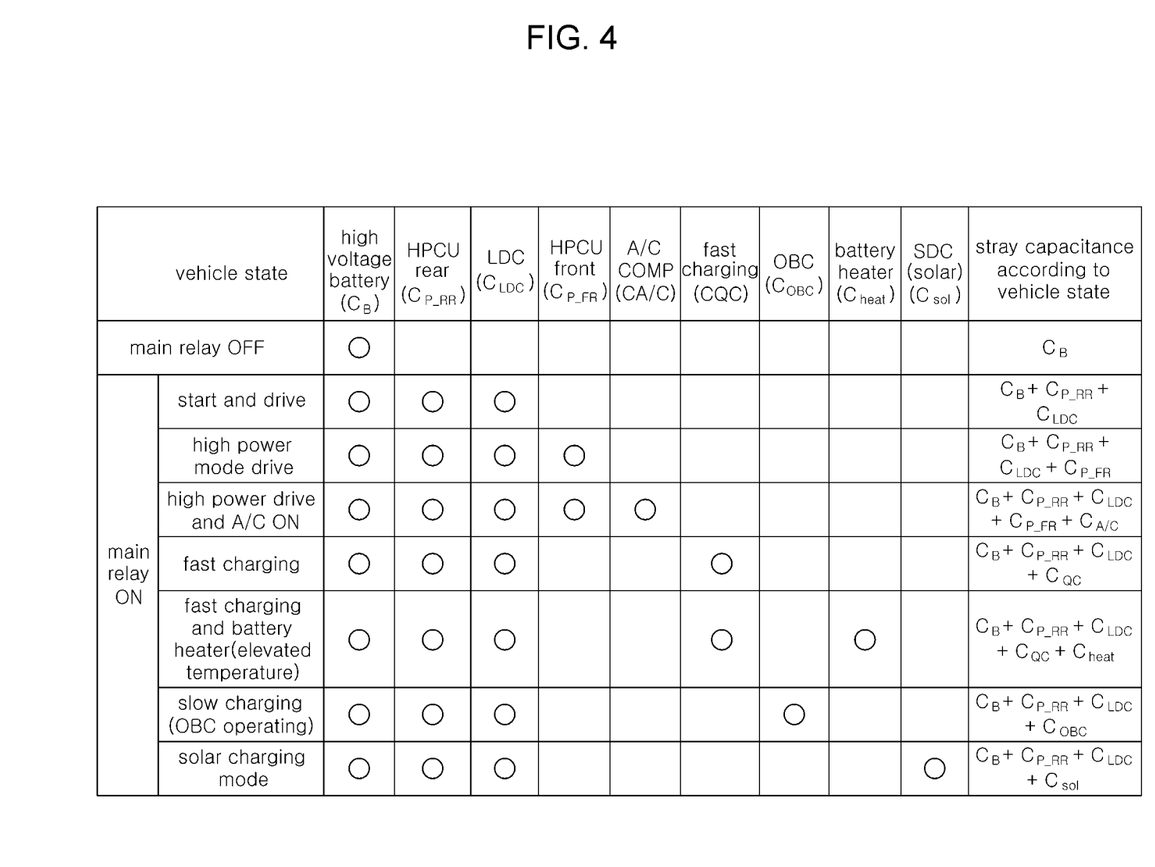
FIG. 4 is a table showing an example of determining a stray capacitance in an apparatus of measuring an insulation resistance according to various exemplary embodiments of the present disclosure.

FIG. 4 is a table showing an example of determining a stray capacitance in an apparatus of measuring an insulation resistance according to various exemplary embodiments of the present disclosure.

Referring to FIG. 4, the stray capacitance value may be changed according to a vehicle state, that is, a connection state of high voltage electrical components. When the main relay 40 is in an OFF state, the controller 20 may measure the insulation resistance by determining a time constant in consideration of the capacitance CB by the Y-capacitor formed at the terminal of the battery 10. This corresponds to insulation resistance measurement performed in a state in which the vehicle is parked after charging and discharging of the battery is completed. Because the stray capacitance value is the smallest when the vehicle is parked, the time constant is also the smallest, and thus the insulation resistance measurement period is shortened, and the time required for frequent insulation resistance measurement is also the shortest. In other words, according to various exemplary embodiments of the present disclosure, because the insulation resistance may be measured rapidly when the vehicle is parked, serious accidents such as battery ignition when parking the vehicle, which is a recent issue, may be prevented in advance.

The controller 20 may optimize the number of insulation resistance measurements by appropriately changing the period for measuring the insulation resistance according to the determined time constant and measuring the insulation resistance according to the changed period.

Conventionally, because a fixed insulation resistance measurement period is applied based on the maximum time constant expected in the high voltage system of a vehicle, even when the stray capacitance by the Y-capacitor of the high voltage electrical component is small, the insulation resistance measurement is performed according to an unnecessarily long period. As a result, there were problems such as taking an excessive amount of time to measure the insulation resistance and lowering efficiency.

However, as mentioned above, in various exemplary embodiments of the present disclosure, the time constant is determined by considering only the capacitance of the Y-capacitor of the high voltage electrical components that are connected according to the connection state of the high voltage electrical components and the battery in the high voltage system and the insulation resistance measurement period is determined according to the determined time constant, so the problems caused by measuring insulation resistance according to an unnecessarily long period even when the time constant is small, such as slowing down of the insulation resistance measurement speed and low efficiency, may be solved.

Figure 5:
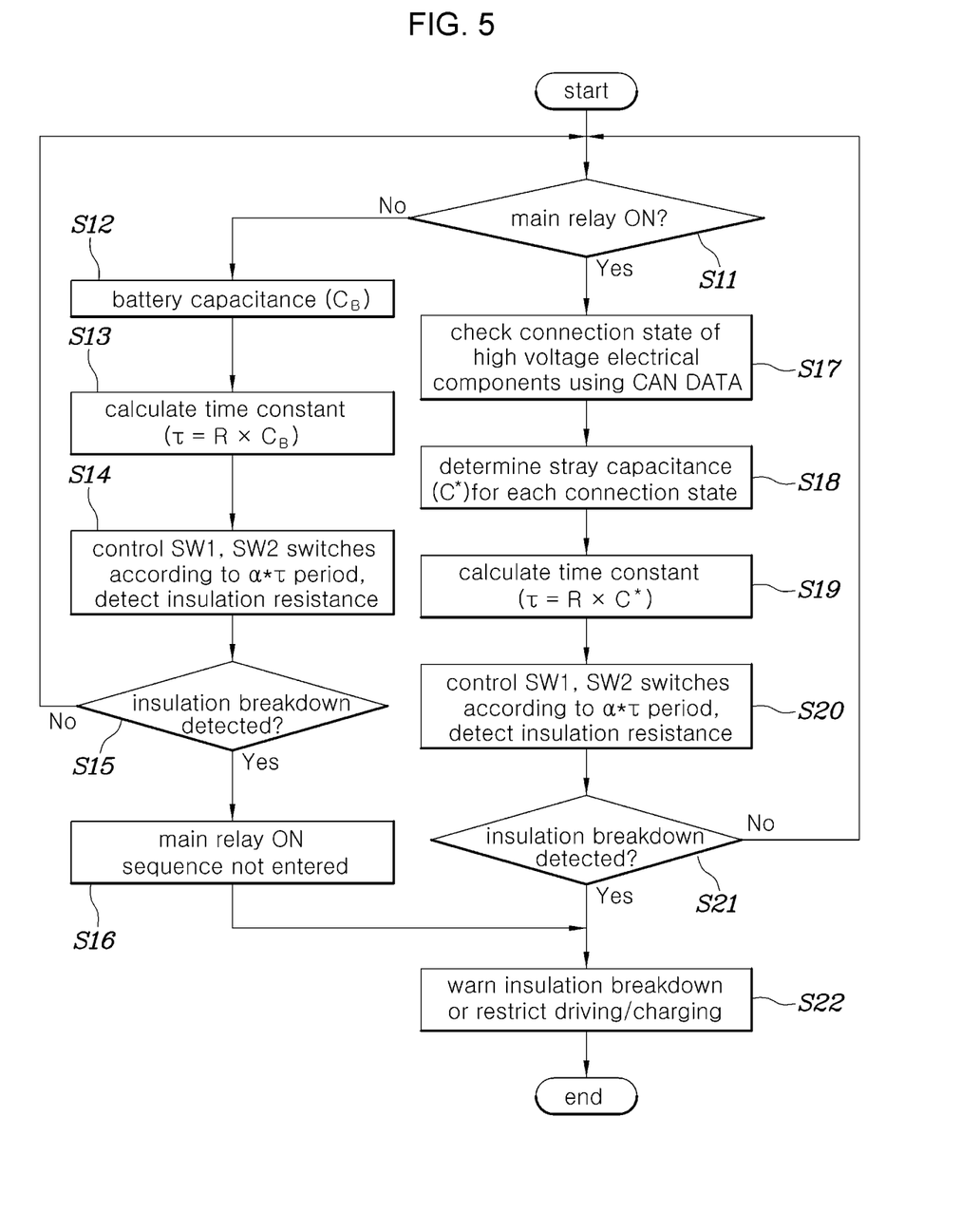
FIG. 5 is a flowchart illustrating a method for measuring an insulation resistance of a vehicle according to various exemplary embodiments of the present disclosure.

FIG. 5 is a flowchart illustrating a method for measuring an insulation resistance of a vehicle according to various exemplary embodiments of the present disclosure. The method for measuring an insulation resistance of a vehicle according to various exemplary embodiments of the present disclosure may be implemented by the above-described apparatus of measuring an insulation resistance of a vehicle.

Referring to FIG. 5, the method for measuring an insulation resistance of a vehicle, according to various exemplary embodiments of the present disclosure, may start S11 from the step S11 of checking the state of the main relay when the controller 20 starts measuring the vehicle insulation resistance.

When it is determined that the main relay 40 is off in the step S11, the controller 20 may determine the size of the stray capacitance used for determining the time constant as a value corresponding to the capacitance CB of the battery 10 in step S12, and determine the time constant by multiplying a resistance value of the voltage dividing resistor R of the insulation resistance measurement circuit 12 and the capacitance CB of the battery 10 as the stray capacitance in step S13. Accordingly, by multiplying the determined time constant by a (a positive number), a period for alternately on-and-off control of the switches SW1 and SW2 in the insulation resistance measurement circuit 12 may be determined, and according to the present period, the insulation resistance may be measured by measuring the voltage at both end portions of the detection resistor Rm in step 14.

In the step S14, α, which is a constant used to determine the on-and-off period of the switches SW1 and SW2, is, as shown in FIG. 3, a positive value used to determine the time it takes from when the switches SW1 and SW2 are turned on until the magnitude of the voltage across both end portions of the detection resistor Rm is gradually decreased according to the time constant to maintain a constant value. The present constant α may be predetermined through an experimental method or the like.

In the step S14, the controller 20 turns on and off the switches SW1 and SW2 a preset number of times according to the determined period, and when each switch SW1, SW2 is in the turned-on state, the controller 20 may detect the insulation resistance of the positive (+) terminal and the insulation resistance of the negative (−) terminal of the battery 10, respectively.

Accordingly, when the voltage across both end portions of the detection resistor Rm detected in the step S14 is less than a predetermined reference value, or the size of the insulation resistance corresponding to the voltage across both end portions of the detection resistor Rm is smaller than a predetermined reference value, the controller 20 may determine S15 that insulation breakdown has occurred and block in advance the main relay 40 from being turned on S16.

Accordingly, the controller 20 may warn that the insulation breakdown of the vehicle has occurred through an in-vehicle cluster or an audio video navigation (AVN) system, etc. (emitting a warning light or popping up a warning message), and in the case of a vehicle provided with a communication module configured for wireless communication, the occurrence of insulation breakdown may be notified to the driver or the vehicle management server, and driving or charging of the vehicle may be restricted S14.

Meanwhile, when it is determined that the main relay is in the ON state in the step S11, the controller 20 may determine the high voltage electrical component currently electrically connected to the battery 10 via CAN communication in step S17.

Next, the controller 20 may determine the stray capacitance, as shown in the table shown in FIG. 4 described above, in consideration of the Y-capacitor of the high voltage electrical component considered to be connected to the battery 20 in step S18.

Accordingly, in step S19, the controller 20 may determine a time constant by multiplying the resistance value R of the voltage dividing resistor of the insulation resistance measuring circuit 12 by the stray capacitance C* determined in the step 518.

Next, the controller 20 may determine the period for alternately on-and-off control of the switches SW1 and SW2 in the insulation resistance measuring circuit 12 by multiplying the determined time constant by α (a positive number), and measure S20 the insulation resistance by measuring the voltage across both the end portions of the detection resistor Rm according to the determined period.

As in the step S14, in the step S20, α, which is a constant used to determine the on-and-off period of the switches SW1 and SW2, is, as shown in FIG. 3, a positive value used to determine the time it takes from when the switches SW1 and SW2 are turned on until the magnitude of the voltage across the detection resistor Rm is gradually decreased according to the time constant to maintain a constant value. The present constant α may be predetermined in advance through an experimental method or the like.

Also, in the same manner as in step S14, in the step S20, the controller 20 turns on and off the switches SW1 and SW2 a preset number of times according to the determined cycle, and when each switch SW1, SW2 is in the turned-on state, the controller 20 may detect the insulation resistance of the positive (+) terminal and the insulation resistance of the negative (−) terminal of the battery 10, respectively.

Accordingly, when the voltage across both end portions of the detection resistor Rm detected in the step S14 is less than a predetermined reference value, or the size of the insulation resistance corresponding to the voltage across both end portions of the detection resistor Rm is smaller than a predetermined reference value, the controller 20 may determine S21 that insulation breakdown has occurred.

When it is determined that insulation breakdown has occurred, the controller 20 may warn that the insulation breakdown of the vehicle has occurred through an in-vehicle cluster or an audio video navigation (AVN) system, etc. (emitting a warning light or popping up a warning message), and in the case of a vehicle provided with a communication module configured for wireless communication, the occurrence of insulation breakdown may be notified to the driver or the vehicle management server, and driving or charging of the vehicle may be restricted S14.

As described above, an apparatus and a method for measuring an insulation resistance of a vehicle according to various embodiments of the present disclosure determine the time constant by considering the capacitance of the Y-capacitor of the high voltage electrical components which is connected according to the connection state of the high voltage electrical components and the battery in the high voltage system, and determine period for measuring the insulation resistance, thus the conventional problem of slowing down of insulation resistance measurement speed and lowering efficiency caused by measuring the insulation resistance according to one period determined based on the maximum time constant of the high voltage system may be solved.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by multiple control devices, or an integrated single control device.

In various exemplary embodiments of the present disclosure, the control device may be implemented in a form of hardware or software, or may be implemented in a combination of hardware and software.

Furthermore, the terms such as "unit", "module", etc. Included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. An apparatus for measuring an insulation resistance of a vehicle provided with a voltage system including a battery and a plurality of electrical components operated by receiving power stored in the battery, the apparatus including:
a controller individually identifying the electrical components electrically connected to the battery among the plurality of electrical components and determining a stray capacitance based on the electrical components electrically connected to the battery, and determining a measurement period for measuring the insulation resistance of the vehicle based on the determined stray capacitance.

2. The apparatus of claim 1, wherein the controller includes an insulation resistance measurement circuit measuring the insulation resistance of a positive (+) terminal of the battery and the insulation resistance of a negative (−) terminal of the battery alternately according to the measurement period, and measuring the insulation resistance by detecting the insulation resistance of the positive (+) terminal of the battery and a voltage applied to a portion of a voltage dividing resistor connected to the negative (−) terminal of the battery.

3. The apparatus of claim 2, wherein the controller determines a time constant by multiplying the determined stray capacitance by a resistance value of the voltage dividing resistor, and determines the measurement period by multiplying the time constant by a preset constant.

4. The apparatus of claim 1, wherein the controller identifies the electrical components electrically connected to the battery via a controller area network (CAN) communication.

5. The apparatus of claim 1, wherein the voltage system further includes a main relay connecting or disconnecting the power of the battery to the plurality of electrical components, and when the main relay is off, the controller determines a capacitance of a Y-capacitor of the battery as the stray capacitance.

6. The apparatus of claim 1, wherein the voltage system further includes a main relay connecting or disconnecting the power of the battery to the plurality of electrical components, and when the main relay is on, the controller determines a total capacitance of Y-capacitors of each of the electrical components electrically connected to the battery as the stray capacitance.

7. The apparatus of claim 1, wherein the voltage system further includes individual relays configured at input terminal of the plurality of electrical components, and
wherein the controller identifies whether the individual relays are turned on to identify the electrical components electrically connected to the battery among the plurality of electrical components.

8. A method for measuring an insulation resistance of a vehicle provided with a voltage system including a battery and a plurality of electrical components operated by receiving power stored in the battery, the method comprising:
identifying, by a controller, the electrical components electrically connected to the battery;
determining, by the controller, a stray capacitance based on the electrical components found to be electrically connected to the battery; and
determining, by the controller, a measurement period for measuring the insulation resistance of the vehicle based on the determined stray capacitance, and measuring the insulation resistance of the vehicle according to the determined measurement period,
wherein in the identifying, the controller individually identifies the electrical components electrically connected to the battery among the plurality of electrical components.

9. The method of claim 8, wherein the voltage system further includes individual relays configured at input terminal of the plurality of electrical components, and
wherein in the identifying, the controller identifies whether the individual relays are turned on to identify the electrical components electrically connected to the battery among the plurality of electrical components.

10. The method of claim 8, wherein in the identifying, the controller identifies the electrical components electrically connected to the battery via a controller area network (CAN) communication.

11. The method of claim 8, wherein in the determining the stray capacitance, the controller determines a total capacitance of Y-capacitors of each of the electrical components found to be electrically connected to the battery as the stray capacitance.

12. The method of claim 8, wherein the voltage system further includes a main relay connecting or disconnecting the power of the battery to the plurality of electrical components, and the method further includes determining, by the controller, whether the main relay is on or off before the identifying.

13. The method of claim 12, wherein in the determining whether the main relay is on or off, when the controller concludes that the main relay is off, the controller determines a capacitance of a Y-capacitor of the battery as the stray capacitance without performing the identifying.

14. The method of claim 13, wherein in the measuring the insulation resistance, when the controller concludes that there is an insulation resistance fault, the method further includes blocking, by the controller, the main relay from being turned on later.

15. The method of claim 8, wherein in the measuring, the controller measures the insulation resistance of a positive (+) terminal of the battery and the insulation resistance of a negative (−) terminal of the battery alternately according to the measurement period, and measures the insulation resistance by detecting the insulation resistance of the positive (+) terminal of the battery and a voltage applied to a portion of a voltage dividing resistor connected to the negative (−) terminal of the battery.

16. The method of claim 15, wherein in the measuring, the controller determines a time constant by multiplying the determined stray capacitance by a resistance value of the voltage dividing resistor, and determines the measurement period by multiplying the time constant by a preset constant.

* * * * *